(12) United States Patent
Kuttuva et al.

(10) Patent No.: US 7,710,163 B2
(45) Date of Patent: May 4, 2010

(54) COMPENSATING A PUSH-PULL TRANSMIT DRIVER

(75) Inventors: Pradeepkumar S. Kuttuva, Bangalore (IN); Shivraj G Dharne, Bangalore (IN)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 12/143,665

(22) Filed: Jun. 20, 2008

(65) Prior Publication Data

US 2008/0315923 A1    Dec. 25, 2008

(30) Foreign Application Priority Data

Jun. 20, 2007    (IN) .................. 1324/DEL/2007

(51) Int. Cl.
*H03K 5/22*    (2006.01)
(52) U.S. Cl. .................. 327/63; 327/65; 327/68; 327/70
(58) Field of Classification Search ............ 327/50–52, 327/56, 60, 63–65, 68–70, 72
See application file for complete search history.

(56) References Cited

U.S. PATENT DOCUMENTS 6,445,218 B1 *    9/2002    Lee .............................. 327/65

* cited by examiner

*Primary Examiner*—An T Luu
(74) *Attorney, Agent, or Firm*—Blakely, Sokoloff, Taylor & Zafman LLP

(57) ABSTRACT

An interface such a PCI-E interface may comprise a transmitter and a compensation circuit. In one embodiment, the transmitter may comprise a transmit driver, which may use a push-pull configuration. The transmit driver may require stable voltages such as (Vdd/2+0.25) and (Vdd/2−0.25) Volts. The compensation circuit may comprise a voltage generator circuit and a dummy driver circuit. The dummy driver may be a replica of the transmit driver. A correction module may generate correction factors based on the deviation of the voltages generated by the dummy driver from the voltages generated by the voltage generator. The voltages provided to the transmit driver are corrected based on the correction factors to compensate for the deviation.

6 Claims, 2 Drawing Sheets

COMPENSATING A PUSH-PULL TRANSMIT DRIVER

This application claims priority to Indian Application Number 1324/DEL/2007, titled "Compensating a Push-Pull Transmit Driver", filed Jun. 20, 2007.

BACKGROUND

An interface unit such as a peripheral component interconnect (PCI) Express interface unit may comprise a transmitter, a receiver, and a compensation unit. The transmitter may comprise a driver circuit in pull-down configuration and the driver circuit may require accurate voltage level such as (Vsupply−0.5) volts. The compensation unit may comprise a dummy driver and a voltage reference generator. The voltage reference generator may comprise voltage addition circuits. The dummy driver may comprise H-bridge circuit, which may be similar to the driver circuit of the transmitter unit. The compensation unit may compare the voltages generated by the voltage reference generator and the dummy driver before generating a correction signal, which may be used to generate accurate voltage levels such as (Vsupply−0.5) volts.

BRIEF DESCRIPTION OF THE DRAWINGS

The invention described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements.

DETAILED DESCRIPTION

The following description describes compensating a push-pull transmit driver. In the following description, numerous specific details such as logic implementations, resource partitioning, or sharing, or duplication implementations, types and interrelationships of system components, and logic partitioning or integration choices are set forth in order to provide a more thorough understanding of the present invention. It will be appreciated, however, by one skilled in the art that the invention may be practiced without such specific details. In other instances, control structures, gate level circuits, and full software instruction sequences have not been shown in detail in order not to obscure the invention. Those of ordinary skill in the art, with the included descriptions, will be able to implement appropriate functionality without undue experimentation.

References in the specification to "one embodiment", "an embodiment", "an example embodiment", indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device).

For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, and digital signals). Further, firmware, software, routines, and instructions may be described herein as performing certain actions. However, it should be appreciated that such descriptions are merely for convenience and that such actions in fact result from computing devices, processors, controllers, and other devices executing the firmware, software, routines, and instructions.

Figure 1:
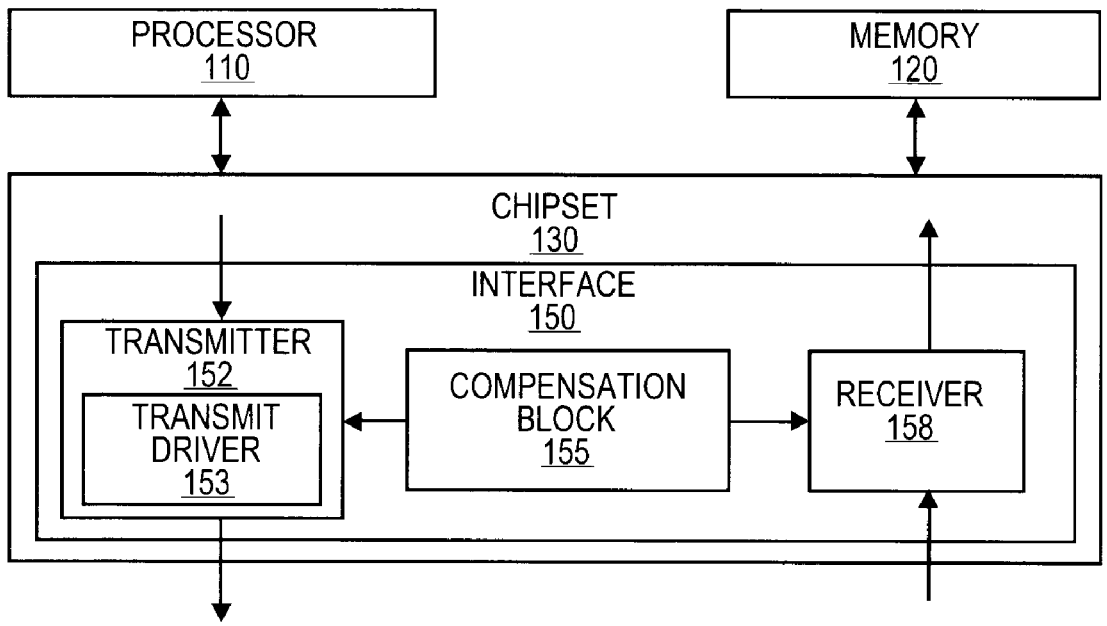
FIG. 1 illustrates a system 100.

A system 100 is illustrated in FIG. 1. In one embodiment, the system 100 may comprise a processor 110, a memory 120, and a chipset 130. In one embodiment, the processor 110 may manage various resources and processes within the system 100 and may comprise one or more microprocessors from family of Intel® microprocessors. The processor 110 and the chipset 130 may be coupled by a front side bus (FSB), which may support transfer of data units and instructions between the processor 110 and the chipset 130. The memory 120 may store data and software instructions and may comprise one or more different types of memory devices such as, for example, DRAM (Dynamic Random Access Memory) devices, SDRAM (Synchronous DRAM) devices, DDR (Double Data Rate) SDRAM devices, or other volatile and/or non-volatile memory devices used in computers.

In one embodiment, the chipset 130 may comprise an interface 150, which may comprise PCI-E interface logic. The interface 150 may comprise a transmitter 152, a compensation block 155, and a receiver 158. In one embodiment, the receiver 158 may receive transactions from the PCI-E devices coupled to the chipset 130 and may send the transactions to the processor 110 or the memory 120.

In one embodiment, the transmitter 152 may transmit the transactions to the PCI-E devices coupled to the chipset 130. In one embodiment, the transmitter 152 may comprise a transmit driver 153, which may use circuit components arranged in a push-pull configuration. In one embodiment, two voltages V1 and V2 may be provided to the transmit driver 153. In one embodiment, the current flowing through the transmit driver 153 may equal 10 mA if the voltages V1 and V2 provided to the transmit driver 153 are, respectively, maintained at (Vdd/2+0.25) volts and (Vdd/2−0.25) volts.

In one embodiment, the compensation block 155 may generate accurate voltages of (Vdd/2+0.25) volts and (Vdd/2−0.25) volts by compensating for the deviation in the voltages generated by the dummy driver, which is a replica of the transmit driver 153. In one embodiment, the compensation block 155 may comprise a voltage generator 220, dummy driver 240, and a correction module 260.

In one embodiment, the voltage generator 220 may generate voltages of (Vdd/2+0.25) volts and (Vdd/2−0.25) volts. In one embodiment, the dummy driver 240 may generate a voltage Vpos across a common node (CP) during a first time duration and a voltage Vneg across the CP during a second time duration. In one embodiment, the correction module 260 may compare the voltage Vpos and (Vdd/2+0.25) volts and Vneg and (Vdd/2−0.25) volts. In one embodiment, the correction module 260 may generate a correction factor based on the deviation of Vpos from (Vdd/2+0.25) volts and Vneg from (Vdd/2−0.25) volts. The compensation block 155 may then use the correction factor to correct the voltages V1 and V2 of the transmit driver 153 to be maintained, respectively, at (Vdd/2+0.25) volts and (Vdd/2−0.25) volts.

Figure 2:
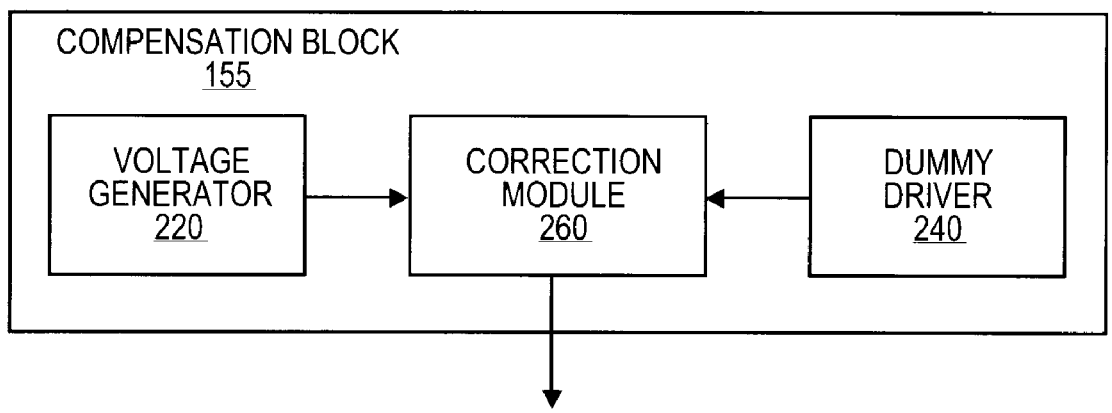
FIG. 2 illustrates a compensation block 155 of FIG. 1.
Figure 3A:
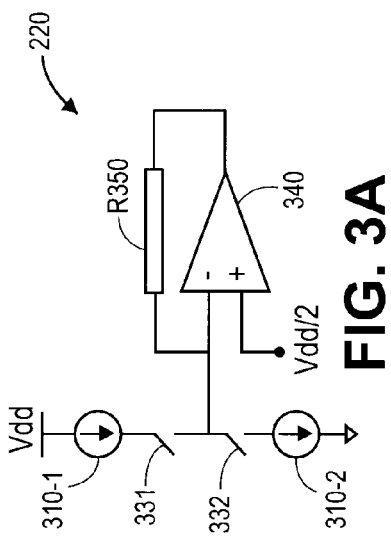
FIG. 3A illustrates an embodiment of a voltage generator of FIG. 2.

FIG. 3A illustrates an embodiment of the voltage generator 220 of FIG. 2. In one embodiment, the voltage generator 220 may comprise stable current sources 310-1 and 310-2, switches 331 and 332, an operational amplifier (op-amp) 340, a resistor R350. In one embodiment, the resistor R350 is provided in the feedback path from the output to the inverting terminal (−) of the op-amp 340. In one embodiment, the non-inverting terminal (+) of the op-amp 340 may be coupled to a voltage divider circuit providing a voltage of Vdd/2. In one embodiment, the op-amp 340 configured in feedback mode may ensure the input common mode to Vdd/2. In one embodiment, the magnitude of the current source 310 may equal I=(250 mv/R350).

In one embodiment, during the time T1, the switch 331 may be closed while maintaining the switch 332 in an open state. Such an arrangement may cause a current 'I' to source into the op-amp 340 and may cause a voltage drop of 250 mv across the resistor R350. As a result, the output of the op-amp 340 may equal (Vdd/2+0.25) volts during T1. In one embodiment, during the time T2, the switch 332 may be closed while maintaining the switch 331 in an open state. Such an arrangement may cause a current of magnitude 'I' to sink from the op-amp 340 and may cause a voltage drop of (−250 mv) across the resistor R350. As a result, the voltage at the output of the op-amp 340 may equal (Vdd/2−0.25) volts, during T2. In one embodiment, the time periods T1 and T2 may be non-overlapping. The output voltages generated by the voltage generator 220 during T1 and T2 may be provided to the correction module 260. In one embodiment, the voltages (Vdd/2+0.25) volts and (Vdd/2−0.25) volts thus, generated may be accurate and stable.

Figure 3B:
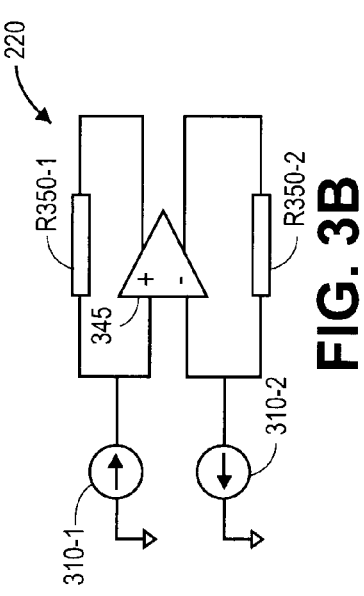
FIG. 3B illustrates another embodiment of the voltage generator of FIG. 2.

FIG. 3B illustrates other embodiment of the voltage generator 220. In one embodiment, the voltage generator 220 may comprise stable current sources 310-1 and 310-2, a dual ended operational amplifier (op-amp) 345, and resistors R350. In one embodiment, the current source 310-1 sourcing a current of I to the op-amp 345 is coupled to the non-inverting terminal (+) of the op-amp 345. The resistor R350-1 may be coupled between a first output terminal and the non-inverting terminal of the op-amp 345. The resistor R350-1 is in the feedback path.

In one embodiment, current I may be sourced to the op-amp 345 and the drop across the resistor R350-1 may equal 250 mV. As a result, the voltage across the first output terminal of the op-amp 345 may equal (Vdd/2+0.25) volts. In one embodiment, a current sink 310-2 may be coupled to the inverting terminal (−) of the op-amp 345. The resistor R350-2 may be coupled between a second output terminal and the inverting terminal of the op-amp 345. The resistor R350-2 is in the feedback path. In one embodiment, a current of I is sunk from the op-amp 345 and the voltage drop across the resistor R350-2 may equal 250 mv. As a result, the voltage across the second output terminal of the op-amp 345 may equal (Vdd/2−0.25) volts. In one embodiment, the voltages (Vdd/2+0.25) volts and (Vdd/2−0.25) volts thus, generated may be accurate and stable.

Figure 3C:
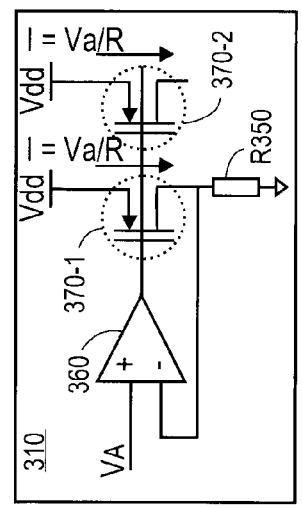
FIG. 3C illustrates an embodiment of a current source of FIG. 3A and FIG. 3B.

FIG. 3C illustrates an embodiment of the current source 310. In one embodiment, the current source 310 may comprise an op-amp 360 and PMOS transistors 370-1 and 370-2, and a resistor R350. In one embodiment, the non-inverting terminal (+) of the op-amp 360 may be coupled to a voltage source of Va, wherein the voltage Va may be generated by a band-gap voltage reference circuit. In one embodiment, the op-amp 360 may be configured in a voltage-to-current conversion (V-I) mode. In one embodiment, the current source 310 may thus generate a stable current of Va/R350. In one embodiment, the voltage Va may equal 250 mV.

Figure 4:
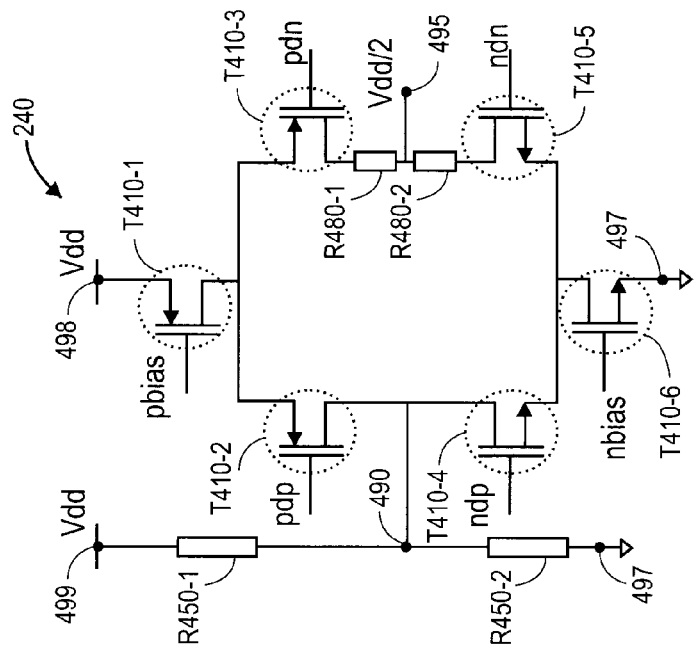
FIG. 4 illustrates an embodiment of a dummy driver of FIG. 2.

FIG. 4 illustrates an embodiment of a dummy driver 240 of FIG. 2. The dummy driver 240 may comprise PMOS transistors T410-1, T410-2, and T410-3, and NMOS transistors T410-4, T410-5, and T410-6. In one embodiment, the size of the transistors T410-1 through T410-6, value of the resistors R450, R480-1 and R480-2, and the configuration in which the transistors and resistors are coupled may be similar to the size of the transistors, value of the resistors, and the configuration used in the transmit driver 153.

In one embodiment, the transistors T410-1 and T410-6 may represent current source transistors and T410-2, T410-3, T410-4, and T410-5 may represent switches. In one embodiment, the source terminal of T410-1 may be coupled to node 498 provided with a voltage source Vdd (supply voltage), the drain terminal of T410-1 may be coupled to the source terminal of T410-2 and T410-3, and the gate terminal of T410-1 may be coupled to the bias voltage 'pbias'. In one embodiment, the gate terminal of T410-2 and T410-3 may be coupled, respectively, to bias voltage 'pdp' and 'ndn'. The drain terminal of T410-2 and the drain terminal T410-4 may be coupled to a common point (CP) 490, which may be coupled to node 499 provided with a voltage source Vdd through an external resistor R450-1. Also, an external resistor R450-2 may be coupled to CP 490 on one end and to a ground point 497 on the other end.

In one embodiment, the drain terminal of T410-3 may be coupled to one end of the resistor R480-1 and the other end of R480-1 may be coupled to a node 495. The gate terminal of T410-4 and T410-5 may be coupled, respectively, to a bias voltage 'ndp' and 'ndn'. The source terminals of T410-4 and T410-5 may be coupled to the drain terminal of T410-6. The drain terminal of T410-5 may be coupled to one end of a resistor R480-2 and the other end of the resistor R480-2 may be coupled to the node 495. The gate terminal of T410-6 may be coupled to a bias voltage 'nbias' and the source terminal may be coupled to a ground point 497.

In one embodiment, during a first time period T5, the bias voltages 'pbias' and 'pdp' may be set such that the transistors T410-1 and T410-2 may be ON and the transistors T410-3, T410-4, T410-5, and T410-6 may be OFF. A p-side current may flow from node 498 through the transistors T410-1 and T410-2 to the CP 490. Also, a current may flow from the node 499 via R450-1 to the node CP 490. The two currents from the node 499 and 498 may sum up and flow through the R450-2 to the ground point 497.

In one embodiment, the resistors R450-1 and R450-2 may be coupled to form a parallel combination and as a result, the drop across the node 490 may equal Vdd/2 due to the voltage source Vdd coupled to the node 499. In one embodiment, the resistors R450-1 may be chosen such that a current of 10 mA flows from the voltage source Vdd coupled to the node 498 through the transistors T410-1 and T410-2, the CP 490, and the resistor R480-2 to the ground point 497.

The voltage drop Vpos across the node 490 may equal Vdd/2 plus the drop due to the current sourced by the voltage source Vdd coupled to the node 498. In one embodiment, the value of the current sourced by the voltage source coupled to the node 498 may equal 10 mA and the value of the resistors R450-1 and R450-2 may equal 50 ohms. As a result, the drop across the node 490 may equal (Vdd/2+0.25) volts {=Vdd/2+10 mA*(parallel combination of R450-1 and 450-2=25 ohms)=250 mV).

In one embodiment, during a second time period T6, the bias voltages 'nbias' and 'ndp' may be set such that the transistors T410-4 and T410-6 may be ON and the transistors T410-1, T410-2, T410-3, and T410-5 may be OFF. A n-side current may flow from node 499 through the resistor R450-1 to the node 490. The current at the node 490 may branch out to flow through the transistors T410-4 and T410-6 to node 497 and through the resistor R450-2 to the ground point 497.

In one embodiment, the branching of current from the node 490 may cause a voltage drop of Vneg across the node CP 490. In one embodiment, if the value of the resistors R450-1 and R450-2 equal 50 ohms and if a current of 10 mA branches out from the node CP490 through the transistors T410-4 and T410-6, the voltage drop Vneg across the node CP490 may equal (Vdd/2−0.25) volts. In one embodiment, the resistors 450-1 and R450-2 may be used for receiver terminal resistor compensation.

Certain features of the invention have been described with reference to example embodiments. However, the description is not intended to be construed in a limiting sense. Various modifications of the example embodiments, as well as other embodiments of the invention, which are apparent to persons skilled in the art to which the invention pertains are deemed to lie within the spirit and scope of the invention.

What is claimed is:

1. An apparatus comprising:
    a voltage generator, wherein the voltage generator is to generate a first voltage and a second voltage,
    a dummy driver comprising a push-pull configuration, wherein the dummy driver is to generate a third voltage and a fourth voltage, and
    a correction module coupled to the voltage generator and the dummy driver, wherein the correction module is to generate a first correction factor by comparing the first voltage and the third voltage and a second correction factor by comparing the second voltage and the fourth voltage,
    wherein the first correction factor is used to correct a deviation of a first supply voltage from the first voltage and the second correction factor is used to correct the deviation of a second supply voltage from the second voltage.

2. The apparatus of claim 1, wherein the first supply voltage and the second supply voltage is provided to a transmit driver, wherein the transmit driver comprises a push-pull configuration.

3. The apparatus of claim 1, wherein the voltage generator further comprises a current-to-voltage converter circuit, wherein the voltage generator is to generate the first voltage during a first duration and the second voltage during the second duration.

4. The apparatus of claim 3, wherein the first voltage is proportional to a first current value sourced by a first current source during the first duration and the second voltage is proportional to a second current value sunk by a second current source during the second duration.

5. The apparatus of claim 4, wherein the voltage generator is to, simultaneously, generate the first voltage proportional to a first current value and the second voltage proportional to a second current value.

6. The apparatus of claim 5, wherein the dummy driver is to generate the third voltage during the first duration and the fourth voltage during the second duration, wherein the third voltage represents the first supply voltage and the fourth voltage represents the second supply voltage.

* * * * *